United States Patent
Kim et al.

(10) Patent No.: US 9,567,672 B2
(45) Date of Patent: Feb. 14, 2017

(54) DEPOSITION APPARATUS AND CLEANSING METHOD USING THE SAME

(71) Applicant: ASM IP Holding B.V., Almere (NL)

(72) Inventors: Dae Youn Kim, Daejeon (KR); Sang-Jin Jeong, Cheonan (KR); Hyun Soo Jang, Daejeon (KR); Young Hoon Kim, Cheonan (KR); Jeong Ho Lee, Seoul (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/834,505

(22) Filed: Aug. 25, 2015

(65) Prior Publication Data
US 2016/0060760 A1    Mar. 3, 2016

(30) Foreign Application Priority Data
Aug. 26, 2014 (KR) .................. 10-2014-0111702

(51) Int. Cl.
C23C 16/455 (2006.01)
B08B 9/093 (2006.01)
C23C 16/44 (2006.01)

(52) U.S. Cl.
CPC ......... *C23C 16/45591* (2013.01); *B08B 9/093* (2013.01); *C23C 16/4405* (2013.01); *C23C 16/45502* (2013.01); *C23C 16/45561* (2013.01); *C23C 16/45574* (2013.01)

(58) Field of Classification Search
CPC ............... C23C 16/45591; C23C 16/45574; C23C 16/4405; C23C 16/45502; C23C 16/45561; B08B 9/093

USPC ........................................... 118/715
See application file for complete search history.

(56) References Cited

U.S. PATENT DOCUMENTS

| | | | | |
|---|---|---|---|---|
| 6,113,984 A * | 9/2000 | MacLeish | ......... | C23C 16/45508 118/715 |
| 6,539,891 B1 * | 4/2003 | Lee | ..................... | C23C 16/4405 118/715 |
| 7,976,898 B2 * | 7/2011 | Hong | ..................... | C23C 16/045 427/248.1 |
| 8,202,575 B2 * | 6/2012 | Monsma | ........... | C23C 16/45544 118/715 |
| 8,215,264 B2 * | 7/2012 | Hong | ..................... | C23C 16/045 118/715 |
| 8,282,735 B2 * | 10/2012 | Choi | ................. | H01L 21/68792 118/715 |
| 8,545,940 B2 * | 10/2013 | Choi | ................. | C23C 16/45504 427/255.15 |
| 8,778,083 B2 * | 7/2014 | Kim | ................. | C23C 16/45504 118/724 |
| 9,062,375 B2 * | 6/2015 | Kim | ................. | C23C 16/45504 |
| 9,085,825 B2 * | 7/2015 | Kim | ....................... | C23C 16/50 |
| 9,145,609 B2 * | 9/2015 | Choi | ................. | C23C 16/45587 |
| 2004/0134611 A1 * | 7/2004 | Kato | ..................... | C23C 16/455 156/345.33 |
| 2005/0034664 A1 * | 2/2005 | Koh | ..................... | C23C 16/455 118/719 |

(Continued)

*Primary Examiner* — Jeffrie R Lund
(74) *Attorney, Agent, or Firm* — Lex IP Meister, PLLC

(57) ABSTRACT

Provided is a deposition apparatus including a connection channel connecting a gas inflow channel and a gas outflow channel so as to increase cleaning efficiency by providing a portion of cleaning gas to the dead space of the gas inflow channel and controlling a flow of a cleaning gas.

19 Claims, 11 Drawing Sheets

(56) References Cited

U.S. PATENT DOCUMENTS

| | | | |
|---|---|---|---|
| 2006/0249077 A1* | 11/2006 | Kim | C23C 16/4412 118/723 MP |
| 2008/0110399 A1* | 5/2008 | Park | C23C 16/45504 118/715 |
| 2008/0241384 A1* | 10/2008 | Jeong | C23C 16/45504 427/255.29 |
| 2011/0308460 A1* | 12/2011 | Hong | C23C 16/045 118/723 E |
| 2013/0045331 A1* | 2/2013 | Kim | C23C 16/45504 427/255.28 |
| 2016/0060760 A1* | 3/2016 | Kim | C23C 16/45591 134/18 |
| 2016/0215392 A1* | 7/2016 | Yudovsky | C23C 16/45551 |

\* cited by examiner

DEPOSITION APPARATUS AND CLEANSING METHOD USING THE SAME

RELATED APPLICATIONS

This application claims priority to and the benefit of Korean Patent Application No. 10-2014-0111702 filed in the Korean Intellectual Property Office on Aug. 26, 2014, the entire contents of which are incorporated herein by reference.

BACKGROUND

1. Field

The described technology relates generally to a deposition apparatus and a cleaning method using the deposition apparatus.

2. Description of the Related Art

As a semiconductor device is gradually miniaturized and demand for precision control of a thin film to be deposited is increased, deposition reactors with various structures for satisfying the demand have been proposed.

Traditionally, a shower-head type of reactor has been frequently used, but due to complexity of its structure, generation of contaminants such as particles and difficulty of removing the contaminants have been pointed out as problems. As an alternative, a flow-type reactor in which gases flow horizontally on the substrate was proposed and has been successfully applied in the actual mass production. Particularly, the flow-type reactor has an advantage of having a simpler structure than the shower-head type reactor and optimizing a volume of a reaction space to swiftly switch gases.

Meanwhile, the importance of cleaning efficiency when the reactor is cleaned after deposition has been increased as much as deposition efficiency when the deposition apparatus is operated. When the cleaning efficiency is low, the maintenance period of the apparatus is increased as much as the low cleaning efficiency and thus actual production efficiency is decreased.

Particularly, in the case of a flow-type deposition apparatus, reaction gas flows through a plurality of gas flow channels, and cleaning gas is supplied through some of the plurality of gas flow channels.

When the cleaning gas is supplied, there is a problem in that cleaning is not sufficiently performed in the gas flow channel because the cleaning gas is not sufficiently supplied to the gas flow channel.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a flow-type deposition apparatus with high cleaning efficiency.

An exemplary embodiment provides a deposition apparatus including: a reaction space; a plurality of gas inlets and gas outlets; a gas flow control guide structure disposed in the reaction space; and a reaction chamber including a substrate supporter installing a substrate in the reaction space, in which the gas flow control guide structure defines a plurality of gas inflow channels disposed between the plurality of gas inlets and the reaction space, a gas outflow channel disposed between the reaction space and the gas outlet, and a connection channel connecting at least one of the plurality of gas inflow channels and the gas outflow channel.

The deposition apparatus may further include an inert gas inlet to which inert gas is supplied, in which the connection channel may be connected to the inert gas inlet.

The gas flow control guide structure may include an upper gas flow control plate and a lower gas flow control plate which are stacked, and the connection channel may be defined by a groove formed in the lower gas flow control plate.

In one aspect of the invention, the groove may have a narrow straight-line shape. In another aspect of the invention, the groove may have a plurality of narrow straight-line shapes. In yet another aspect of the invention, the groove may have a shape which is widened toward an edge of the lower gas flow control plate from the center of the lower gas flow control plate.

A plurality of inert gas inlets may be included, a plurality of connection channels may be included, and each one of the plurality connection channels may be connected with a respectively corresponding one of the plurality of inert gas inlets.

According to the exemplary embodiment, it is possible to increase production efficiency by increasing cleaning efficiency.

DETAILED DESCRIPTION

Various advantages and features of the present invention and methods accomplishing thereof will become apparent from the following description of embodiments with reference to the accompanying drawings. However, the present invention is not limited to exemplary embodiments disclosed herein, but can be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Hereinafter, an exemplary embodiment will be described in more detail with reference to the accompanying drawings.

Figure 1:
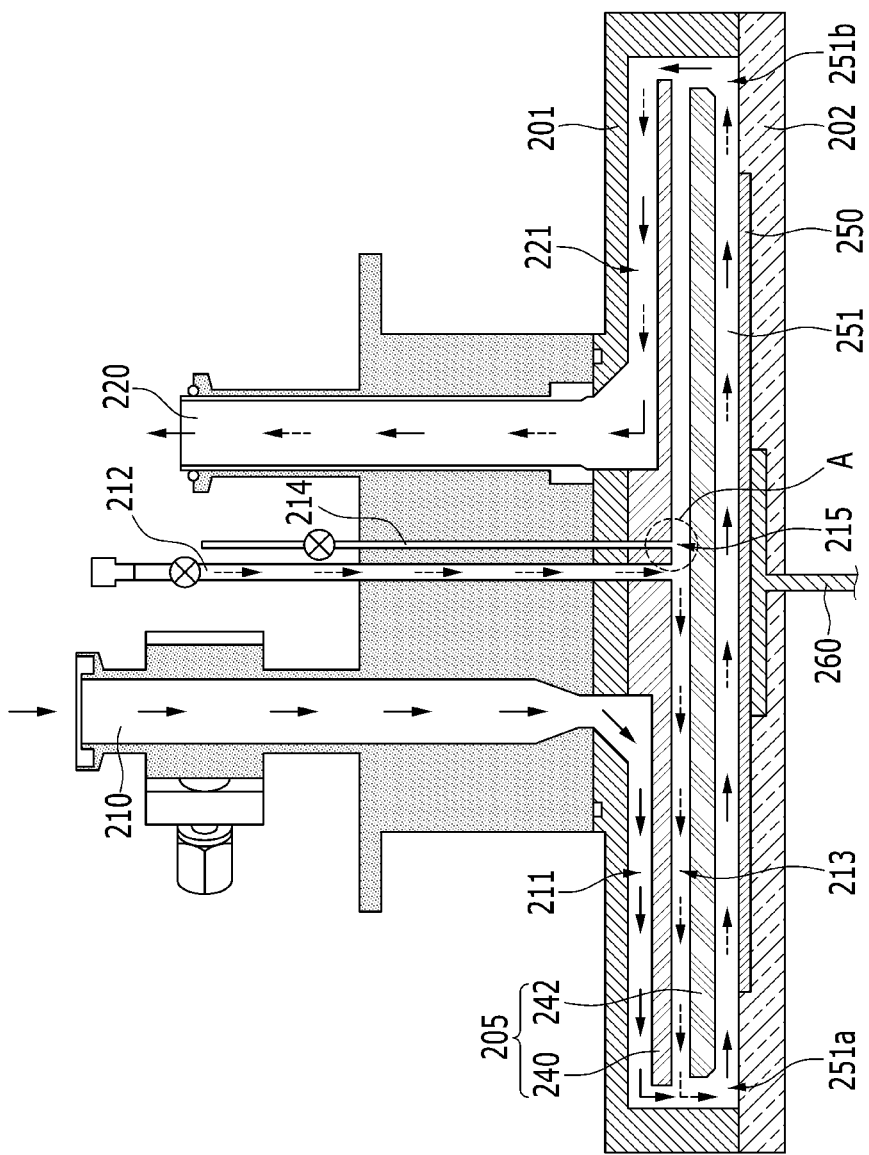
FIG. 1 is a cross-sectional view illustrating a deposition apparatus according to an exemplary embodiment.
Figure 2A:
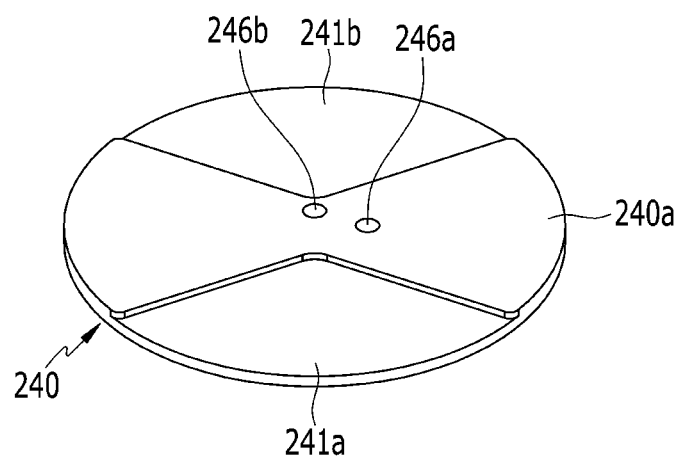
FIG. 2A is a plan view illustrating an upper gas flow control plate of FIG.
Figure 2B:
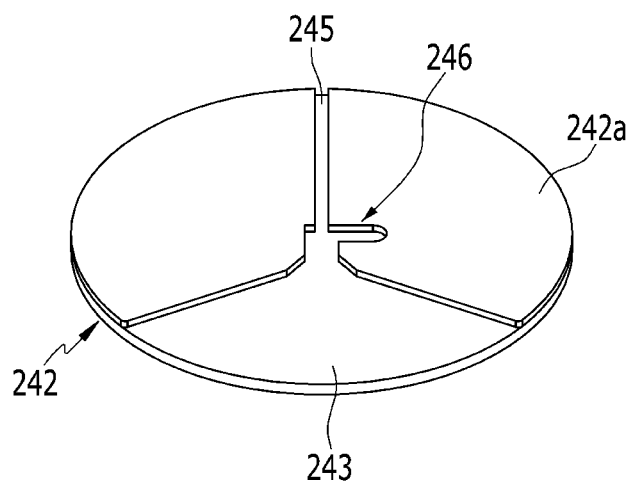
FIG. 2B is a plan view illustrating a lower gas flow control plate of FIG. 1.

First, a deposition apparatus according to an exemplary embodiment will be described with reference to FIGS. 1, 2A, and 2B. FIG. 1 is a cross-sectional view illustrating a deposition apparatus according to an exemplary embodiment, FIG. 2A is a plan view illustrating an upper gas flow control plate of FIG. 1, and FIG. 2B is a plan view illustrating a lower gas flow control plate of FIG. 1.

A deposition apparatus according to the exemplary embodiment includes a reactor cover 201 and a reactor support 202. The reactor cover 201 and the reactor support 202 contact each other to define a reaction chamber.

A first gas inflow pipe 210, a second gas inflow pipe 212, a third gas inflow pipe 214 and a gas outflow pipe 220 are included on the reactor cover 201.

A reaction space 251 is defined as a space between an upper surface of the reactor supporter 202 which supports the substrate and a lower surface of a lower gas flow control plate 242. The reaction space 251 includes an inflow portion 251a in which process gas and the like flows, and an outflow portion 251b from which remaining process gas after being used in the process or a reaction by-product flows out.

The first gas inflow pipe 210 and the second gas inflow pipe 212 are connected with reaction sources such as precursors and/or reaction gases (not illustrated). The first gas inflow pipe 210 and the second gas inflow pipe 212 are configured to supply first reaction gas and second reaction gas, respectively, and preferably, the reaction gases flow in through the first gas inflow pipe 210 and the second gas inflow pipe 212 as a gas phase. A valve is provided on the first gas inflow pipe 210 and the second gas inflow pipe 212, respectively, to control the flow of reaction gas and inert purge gas. For example, a three-way valve is used to control any one of the inert gas and the reaction gases to be supplied to the first and second gas inflow pipes 210 and 212. The deposition apparatus may also include a switching device for controlling the valve. For example, a programmed computer is used as the switching device to sequentially supply the reaction gases and the inert purge gas according to a gas supply period of an atomic layer deposition method.

The gas flow control guide structure 205 includes an upper gas flow control plate 240 and a lower gas flow control plate 242.

The upper gas flow control plate 240 is connected with the first gas inflow pipe 210 to define a first gas inflow channel, and the lower gas flow control plate 242 is connected with the second gas inflow pipe 212 to define a second gas inflow channel.

The lower gas flow control plate 242 defines an upper portion of the reaction space, and the lower surface of the lower gas flow control plate 242 is spaced apart from the installed substrate 250 by the reaction space to face the substrate 250.

The upper gas flow control plate 240 is stacked on the lower gas flow control plate 242, and the central portion of the upper gas flow control plate 240 is attached on an inner bottom surface of the reactor cover 201. In another exemplary embodiment, the gas flow control guide structure 205 may further include an additional gas flow control plate according to the number of reaction gases supplied to the reaction chamber. The upper gas flow control plate 240 and the lower gas flow control plate 242 may be assembled to be separated from the deposition apparatus so that maintenance, cleaning, or the like through this configuration may be easily performed. However, the upper gas flow control plate 240 and the lower gas flow control plate 242 may form one body as a constituent element of the reactor cover of the deposition apparatus.

The gas flow control guide structure 205 defines a first inflow channel 211, a second inflow channel 213, and an outflow channel 221, and each of the first inflow channel 211 and the second inflow channel 213 has an individual flow path and a gas flows into the reaction space 251 through each gas inflow channel.

The deposition apparatus according to the exemplary embodiment includes a connection channel 215 connecting the second inflow channel 213 and the outflow channel 221 which are defined by the lower gas flow control plate 242 as illustrated in a portion represented as A in FIG. 1. During the cleaning process, a part of the cleaning gas flowing in through the first inflow channel 211 and the second inflow channel 213 is supplied to the second inflow channel 213 by absorption force of the outflow channel 221 and then discharged to the outflow channel 221 through the connection channel 215. As a result, a residual thin film which remains on the gas flow control plates 240 and 242 may be fully removed.

The connection channel 215 may be connected with the third gas inflow pipe 214 and inert gas may flow in the third gas inflow pipe 214.

The inert gas is supplied to the third gas inflow pipe 214 and supplied only during the deposition process. The inert gas supplied through the third gas inflow pipe 214 is supplied to the connection channel 215 to serve to prevent source gas supplied through the second inflow channel 213 from flowing in the gas outflow channel through the connection channel 215. A flow rate of the inert gas supplied through the third gas inflow pipe 214 is smaller than a total flow rate of the source gas and the carrier gas so as to prevent the source gas and the carrier gas supplied to the second inflow channel 213 from back-flowing toward the second inflow channel 213 and thus may not interfere with the inflow of the source gas supplied through the second inflow channel 213.

Further, during the cleaning process, the inert gas is not supplied to the third gas inflow pipe 214, and as a result, the flowing cleaning gas may smoothly flow out to the outflow channel 221 through the connection channel 215.

A valve is added on an upper end of the third gas inflow pipe 214 to control supplying and blocking the inert gas.

Further, a valve is added even to a source gas supply pipe to block the source gas supply pipe during the cleaning process, and as a result, preventing the cleaning gas flowing into the second inflow channel 213 from flowing into the source gas supply pipe and damaging the valve or an internal component in the source gas supply pipe.

Next, the upper gas flow control plate 240 and the lower gas flow control plate 242 will be described with reference to FIGS. 2A and 2B.

Referring to FIG. 2A, the upper gas flow control plate 240 has a first inflow groove 241a and a second inflow groove 241b which are tapered toward the central portion. That is, the first and second inflow grooves 241a and 241b have a fan shape which is widened from the central portion to the edge of the upper gas flow control plate 240. The first inflow groove 241a defines the first inflow channel 211 of the first reaction gas supplied through the first gas inflow pipe 210 together with a part of the internal lower surface of the reactor cover 201. The second inflow groove 241b defines the outflow channel 221 of the processed gas which remains after reaction and reaction by products together with the other part of the internal lower surface of the reactor cover 201. The upper gas flow control plate 240 has a first through hole 246a and a second through hole 246b which vertically pass through the upper gas flow control plate 240. The first and second through holes 246a and 246b are configured so that gas flows by connecting a central groove 246 of the lower gas flow control plate 242 to be described below in detail with reference to FIG. 2B with the second gas inflow pipe 212 and connecting a connection groove 245 with the third gas inflow pipe 214. The upper gas flow control plate 240 further includes a first convex portion 240a at the center surrounding a space between the first inflow groove 241a and the second inflow groove 241b. The first convex portion 240a defines side walls of the first inflow groove 241a and the second inflow groove 241b, allows the gas flowing in from the first gas inflow pipe 210 to flow in an outer circumferential direction of the upper gas flow control plate 240 to flow into the reaction space, and allows the gas passing through the reaction space to flow in another outer circumferential direction, that is, allows the gas to flow toward the gas outflow pipe 220.

Referring to FIG. 2B, the lower gas flow control plate 242 has a lower inflow groove 243 which is tapered to the center and a connection groove 245 which is connected with the lower inflow groove 243. The lower inflow groove 243 has a fan shape. The lower inflow groove 243 defines the second inflow channel 213 of the second reaction gas supplied from the second gas inflow pipe 212 together with the lower surface of the upper gas flow control plate 240. The connection groove 245 is connected with the lower inflow groove 243 to define the connection channel 215. The lower inflow groove 243 further extends to the central groove 246 of the lower gas flow control plate 242, and the second inflow channel 213 is connected with the second gas inflow pipe 212 through the first through hole 246a of the upper gas flow control plate 240 and then the gas may flow through them. Further, the connection groove 245 and the third gas inflow pipe 214 are connected to each other through the second through hole 246b and then the gas may flow through them.

The lower surface of the lower gas flow control plate 242 and the upper surface of the reactor support 202 define the reaction space 251 in which the substrate 250 is processed. A non-uniform distance between the lower surface of the lower gas flow control plate 242 and the upper surface of the reactor support 202 may be controlled according to an optimal space configuration for properly supplying the reaction gas. The lower gas flow control plate 242 also has a second convex portion 242a formed around the lower inflow groove 243 and the connection groove 245. The second convex portion 242a defines side walls of the lower inflow groove 243 and the connection groove 245, allows the gas supplied from the second gas inflow pipe 212 to flow in an outer circumferential direction of the lower gas flow control plate 242 to flow into the reaction space, and allows the gas passing through the reaction space to flow in another outer circumferential direction, that is, allows the gas to flow toward the gas outflow pipe 220 defined by the upper gas flow control plate 240. Further, the supplied cleaning gas flows toward the gas outflow pipe 220 through the connection groove 245.

Next, the connection groove 245 and the connection channel 215 of the deposition apparatus according to the exemplary embodiment will be described with reference to FIGS. 3A and 3B.

Figure 3A:
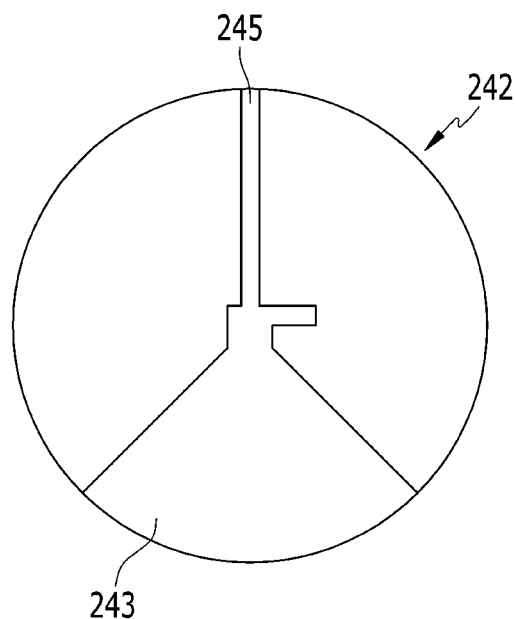
FIGS. 3A, 3B, and 3C are plan views illustrating another exemplary embodiment of the lower gas flow control plate of FIG. 1.
Figure 3B:
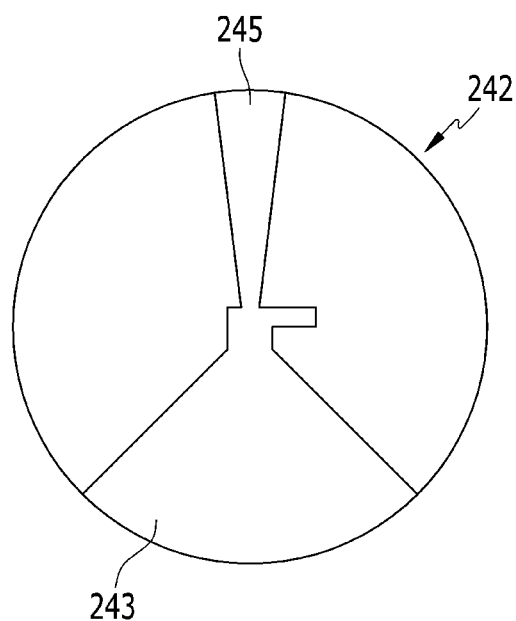
Figure 3C:
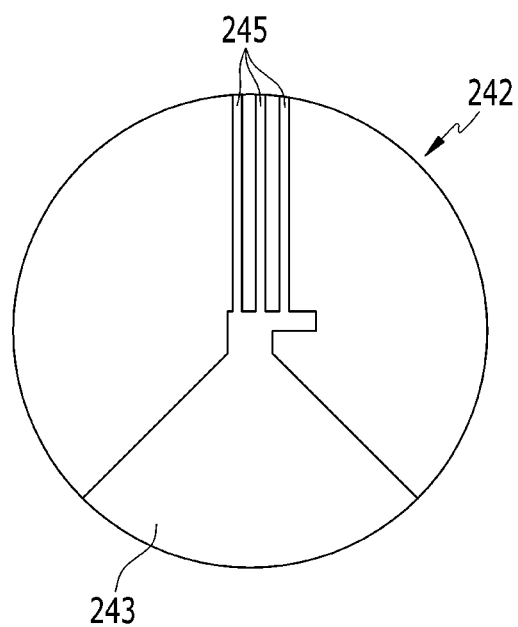

Referring to FIG. 3A, the connection groove 245 and the connection channel 215 have a narrow straight-line shape. Referring to FIG. 3B, the connection groove 245 and the connection channel 215 may have a shape which is widened toward the edge from the center of the lower gas flow control plate 242. In this case, the absorption force of the outflow channel 221 may be increased and a passing speed of the cleaning gas is increased, and as a result, the cleaning efficiency is increased by the absorption force. Referring to FIG. 3C, the connection groove 245 and the connection channel 215 are formed in a plurality of narrow straight-line shapes to increase an amount of the cleaning gas supplied per unit time, increase the cleaning efficiency, and reduce the cleaning time. In the case of having the connection groove 245 and the connection channel 215 with the shapes illustrated in FIG. 3C, the number of third gas inflow pipes 214 to which the inert gas is supplied is equal to the number of the connection grooves 245 and connection channels 215 to connect each inert gas supply pipe to each connection channel 215.

Figure 4:
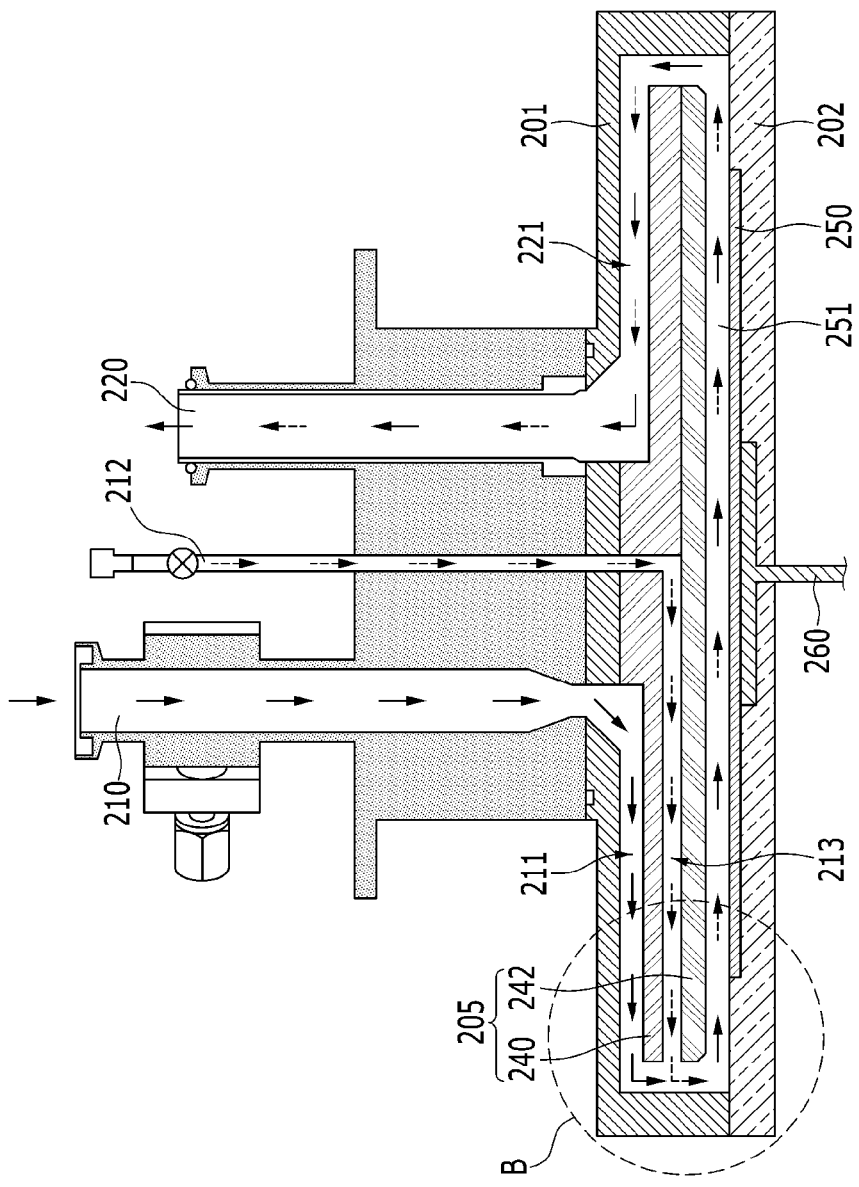
FIG. 4 is a cross-sectional view illustrating a deposition apparatus in the related art.

Next, a deposition apparatus in the related art will be described with reference to FIGS. 4, 5A, and 5B. FIG. 4 is a cross-sectional view illustrating a deposition apparatus in the related art, and FIGS. 5A and 5B are diagrams illustrating a part of the deposition apparatus of FIG. 4.

Referring to FIG. 4, in the deposition apparatus in the related art, unlike the deposition apparatus according to the exemplary embodiment, the connection channel 215 connecting the second inflow channel 213 which is defined by the lower gas flow control plate 242 and the outflow channel 221 is not formed.

Figure 5A:
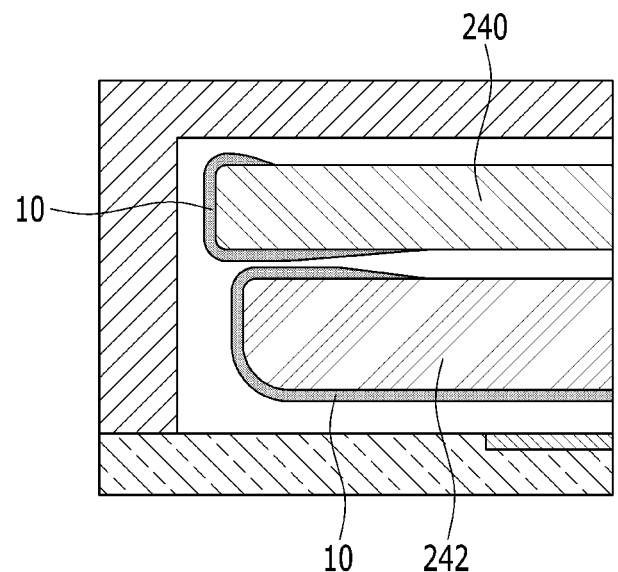
FIGS. 5A and 5B are diagrams illustrating a part of the deposition apparatus of FIG. 4.
Figure 5B:
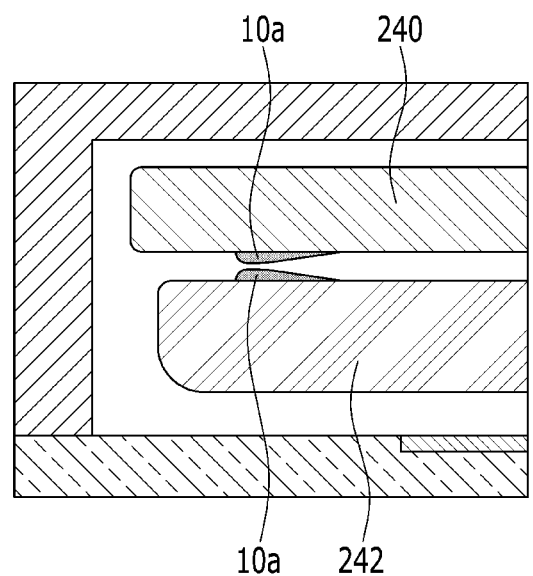

Referring to FIG. 5A, during the deposition process, an unnecessary thin film layer 10 may be deposited around the upper gas flow control plate 240 and the lower gas flow control plate 242.

When the cleaning process is performed by using the deposition apparatus in the related art, it is difficult to move the cleaning gas flowing in through the first inflow channel 211 toward the second inflow channel 213 defined by the lower gas flow control plate 242. Accordingly, as illustrated in FIG. 5B, a part 10a of the unnecessary thin film layer 10 formed during the deposition process remains even after the cleaning process.

However, according to the deposition apparatus according to the exemplary embodiment, since the connection channel 215 connecting the second inflow channel 213 which is defined by the lower gas flow control plate 242 and the outflow channel 221 is formed, the cleaning gas flowing in through the first inflow channel 211 may sufficiently move toward the second inflow channel 213 defined by the lower gas flow control plate 242.

As such, the connection channel 215 connecting the second inflow channel 213 which is defined by the lower gas flow control plate 242 and the outflow channel 221 is formed, and as a result, a part of the cleaning gas is supplied to the second inflow channel 213 by the absorption force of the outflow channel 221 to flow out to the outflow channel 221 through the connection channel 215. Therefore, a residual thin film which remains on the gas flow control plates 240 and 242 may be fully removed.

Figure 6:
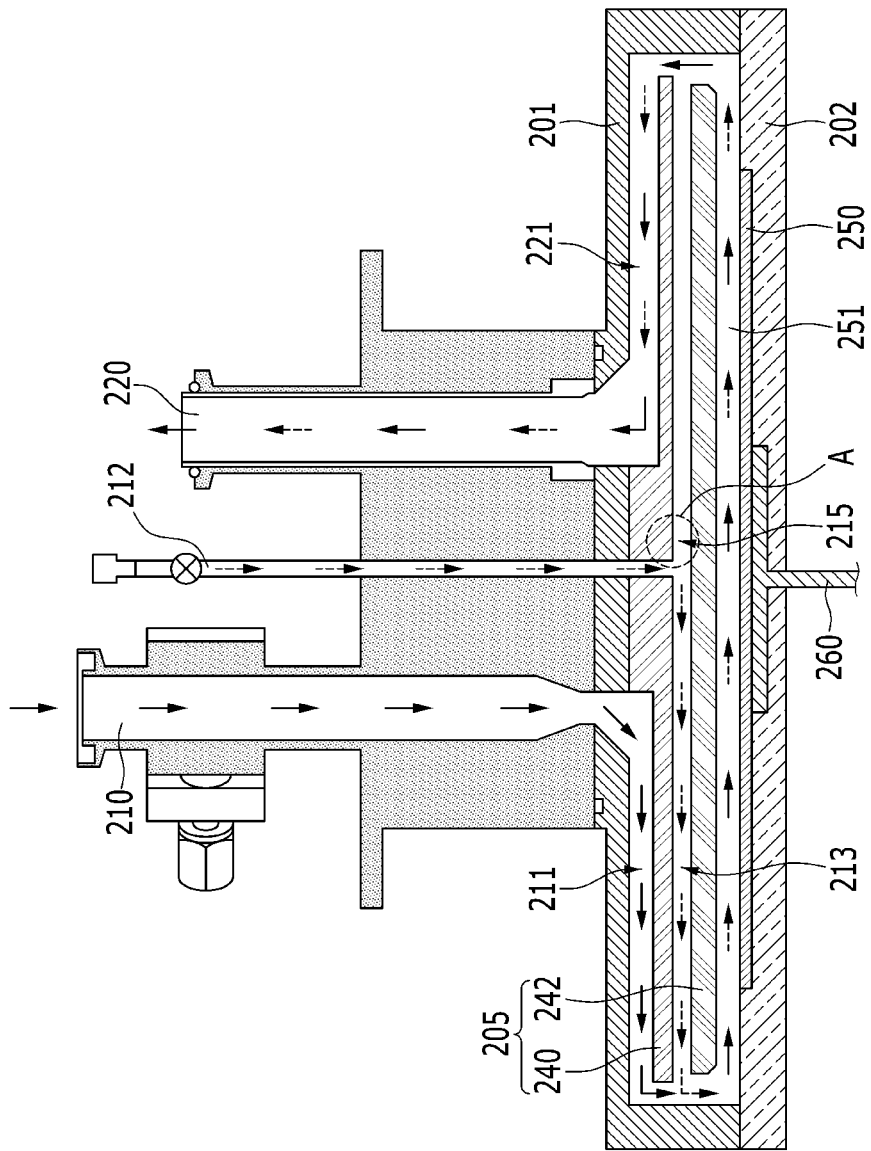
FIG. 6 is a cross-sectional view illustrating a deposition apparatus according to another exemplary embodiment.

Next, a deposition apparatus according to another exemplary embodiment will be described with reference to FIG. 6. FIG. 6 is a cross-sectional view illustrating a deposition apparatus according to another exemplary embodiment.

Referring to FIG. 6, the deposition apparatus according to the exemplary embodiment is similar to the deposition apparatus according to the exemplary embodiment illustrated in FIG. 1.

However, in the deposition apparatus according to the exemplary embodiment, unlike the deposition apparatus according to the exemplary embodiment illustrated in FIG. 1, the third gas inflow pipe 214 connected to the connection channel 215 is omitted. The omission of the third gas inflow pipe 214 simplifies the structure of the deposition apparatus.

Many features of the deposition apparatus according to the exemplary embodiment described above with reference to FIGS. 1, 2A and 2B, and 3A to 3C may be applied to the deposition apparatus according to the exemplary embodiment.

Figure 7:
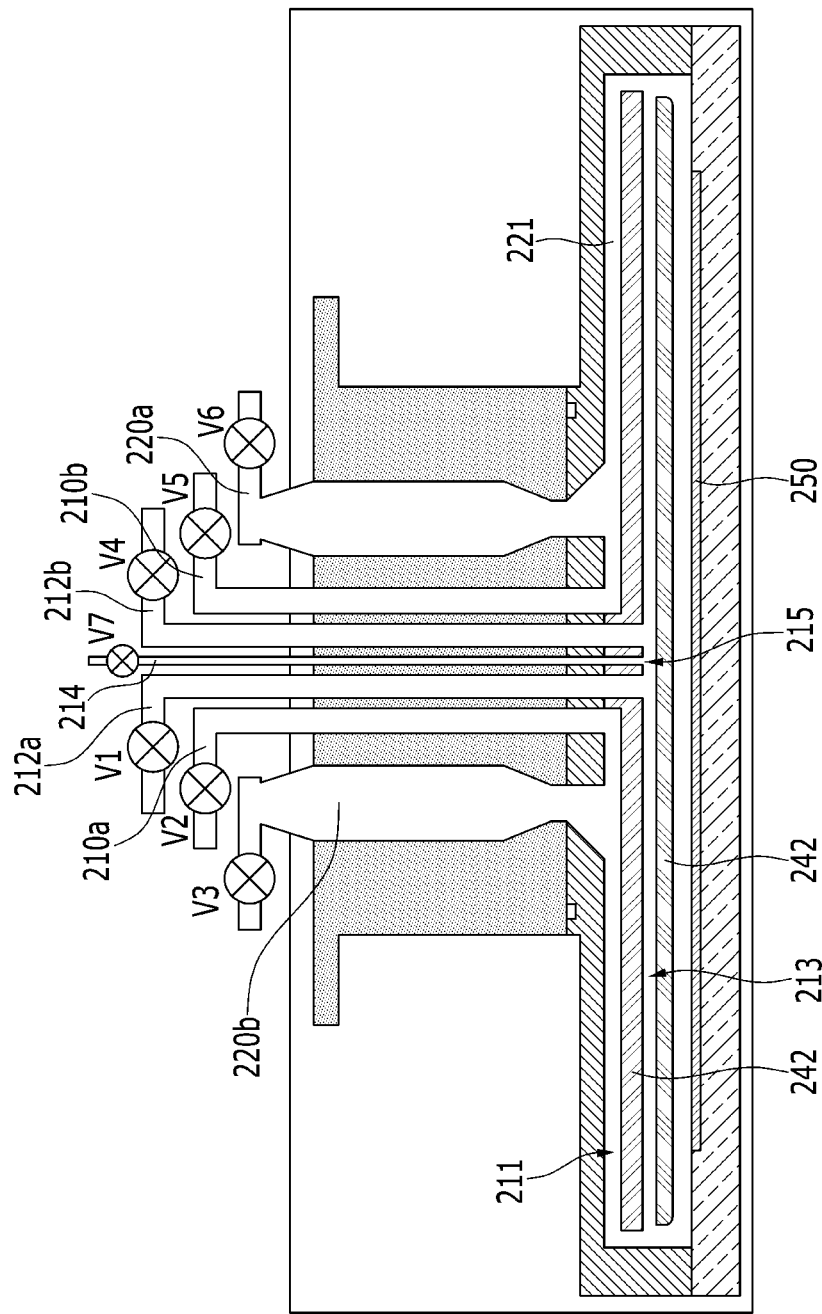
FIG. 7 is a cross-sectional view illustrating a deposition apparatus according to yet another exemplary embodiment.
Figure 8A:
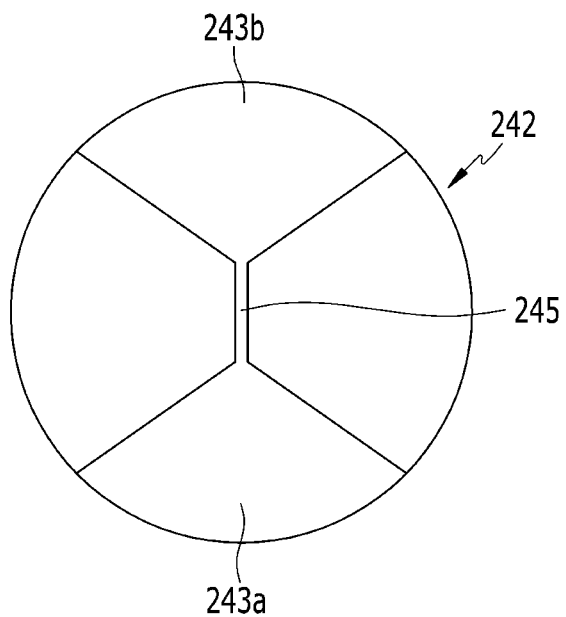
FIGS. 8A and 8B are plan views illustrating a lower gas flow control plate of FIG. 7.
Figure 8B:
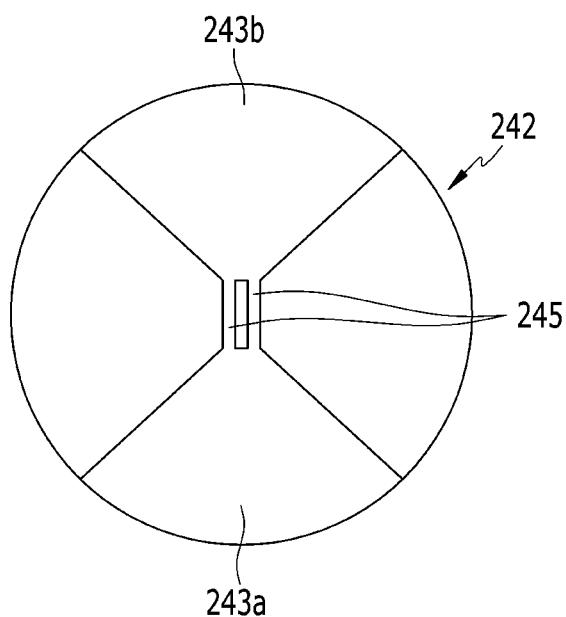

Next, a deposition apparatus according to yet another exemplary embodiment will be described with reference to FIGS. 7, 8A, and 8B. FIG. 7 is a cross-sectional view illustrating a deposition apparatus according to yet another exemplary embodiment, and FIGS. 8A and 8B are plan views illustrating a lower gas flow control plate of FIG. 7.

Referring to FIG. 7, the deposition apparatus according to the exemplary embodiment includes a first sub-gas-inflow pipe 210a, a second sub-gas-inflow pipe 212a, a third sub-gas-inflow pipe 210b, a fourth sub-gas-inflow pipe 212b, a first sub-gas-outflow pipe 220a, a second sub-gas-outflow pipe 220b, and a third gas inflow pipe 214.

To the first sub-gas-inflow pipe 210a, the second sub-gas-inflow pipe 212a, the third sub-gas-inflow pipe 210b, the fourth sub-gas-inflow pipe 212b, the first sub-gas-outflow pipe 220a, the second sub-gas-outflow pipe 220b, and the third gas inflow pipe 214, first to seventh valves v1, v2, v3, v4, v5, v6, and v7, respectively, are connected.

The first sub-gas-inflow pipe 210a and the third sub-gas-inflow pipe 210b are positioned at both sides to be symmetrical to each other, the second sub-gas-inflow pipe 212a and the fourth sub-gas-inflow pipe 212b are positioned at both sides to be symmetrical to each other, and the first sub-gas-outflow pipe 220a and the second sub-gas-outflow pipe 220b are positioned at both sides to be symmetrical to each other.

After the process gas flows in through the first sub-gas-inflow pipe 210a and the second sub-gas-inflow pipe 212a, the process gas flows out through the first sub-gas-outflow pipe 220a positioned in an opposite direction based on the substrate 250, and after the process gas flows in through the third sub-gas-inflow pipe 210b and the fourth sub-gas-inflow pipe 212b, the process gas flows out through the second sub-gas-outflow pipe 220b positioned in an opposite direction based on the substrate 250. As such, the process gas alternately flows in two-way directions to reduce a deviation in thickness of the deposited film in the flow-type reactor.

The deposition apparatus according to the exemplary embodiment has a connection channel 215 connecting the second inflow channel 213 and the gas outflow pipes 220a and 220b which are positioned in opposite directions based on the substrate 250.

The third gas inflow pipe 214 in which the inert gas flows is connected to the connection channel 215. However, the third gas inflow pipe 214 connected to the connection channel 215 may be omitted.

Referring to FIG. 8A, the lower gas flow control plate 242 of the deposition apparatus according to the exemplary embodiment includes a first lower inflow groove 243a and a second lower inflow groove 243b defining two second inflow channels 213 which are positioned at both sides based on the substrate 250, and a connection groove 245 connecting the first lower inflow groove 243a and the second lower inflow groove 243b and defining the connection channel 215. The connection groove 245 may have a narrow straight-line shape.

Referring to FIG. 8B, the connection groove 245 has a plurality of narrow straight-line shapes.

Figure 9A:
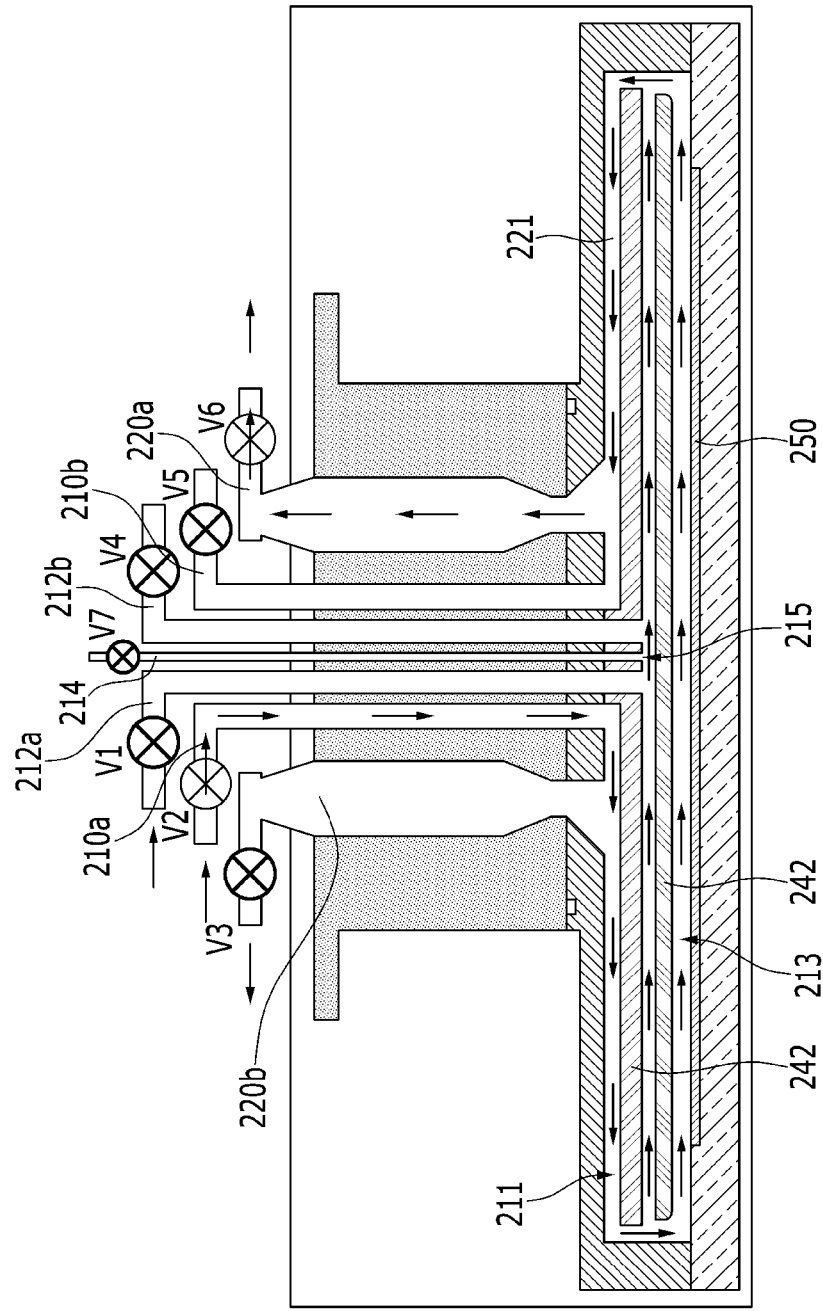
FIGS. 9A and 9B are conceptual views illustrating a gas flow in the deposition apparatus according to the exemplary embodiment of FIG. 7.
Figure 9B:
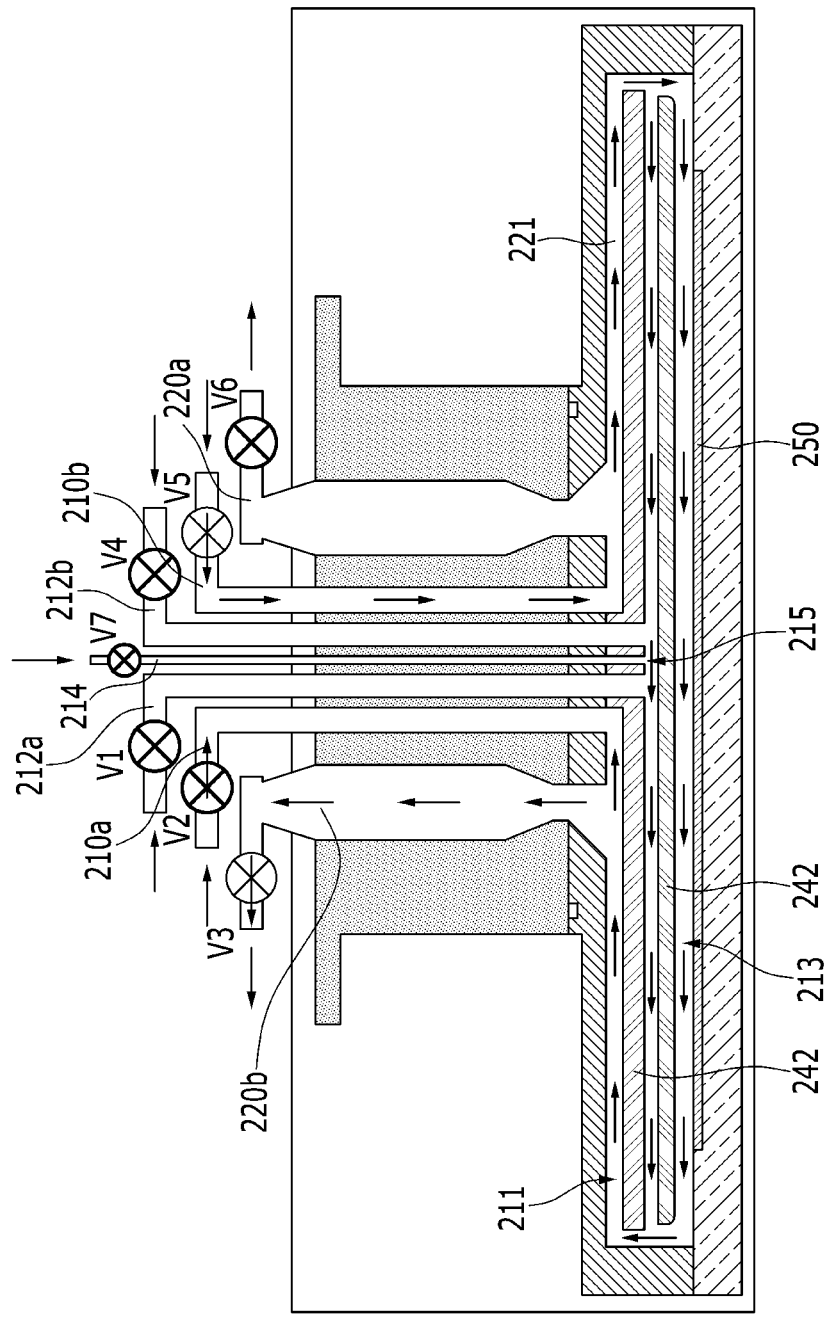

Next, a process of using the deposition apparatus according to the exemplary embodiment of FIG. 7 will be described with reference to FIGS. 9A and 9B. FIGS. 9A and 9B are conceptual views illustrating a gas flow of the deposition apparatus according to the exemplary embodiment of FIG. 7.

In the first process, after the process gas flows in through the first sub-gas-inflow pipe 210a and the second sub-gas-inflow pipe 212a, the process gas flows out through the first sub-gas-outflow pipes 220a which are positioned in opposite directions based on the substrate 250. In this case, valves v3, v4, and v5 connected to the third sub-gas-inflow pipe 210b, the fourth sub-gas-inflow pipe 212b, and the second sub-gas-outflow pipe 220b are closed. Further, the seventh valve v7 connected to the third gas inflow pipe 214 is maintained in an opened state and thus the inert gas flows in through the third gas inflow pipe 214.

In the second process, after the process gas flows in through the third sub-gas-inflow pipe 210b and the fourth sub-gas-inflow pipe 212b, the process gas flows out through the second sub-gas-outflow pipes 220b which are positioned in opposite directions based on the substrate 250. In this case, the valves v1, v2, and v6 connected to the first sub-gas-inflow pipe 210a, the second sub-gas-inflow pipe 212a, and the first sub-gas-outflow pipe 220a are closed. Further, the seventh valve v7 connected to the third gas inflow pipe 214 is maintained in an opened state and thus the inert gas flows in through the third gas inflow pipe 214.

After the first process is repeated many times, the second process is repeated many times, and as a result, a thin film having a uniform thickness may be deposited on the substrate 250.

After the first process and the second process are repeated, the cleaning process is performed.

The cleaning process is a dry cleaning process, and in this case, as the cleaning gas, a gas containing fluorine (F) which is easy to clean, such as $NF_3$, $ClF_3$, and $F_2$, is used.

Referring to FIG. 9A, in the first cleaning process, the cleaning gas is supplied through the first sub-gas-inflow pipe 210a and flows out through the first sub-gas-outflow pipe 220a to remove the residual thin film which remains around the gas flow control plate. In this case, the other valves v1, v3, v4, v5, and v7 except for the second valve v2 and the sixth valve v6 are closed.

In the first cleaning process, the cleaning gas may be supplied to the second lower inflow groove 243b by the absorption force through the connection channel 215 to remove the residual thin film which remains in the blind area in the cleaning process of the existing apparatus.

Next, referring to FIG. 9B, in the second cleaning process, the cleaning gas is supplied through the third sub-gas-inflow pipe 210b and flows out through the second sub-gas-outflow pipe 220b to remove the residual thin film which remains around the gas flow control plate. In this case, the other valves v1, v2, v4, v6, and v7 except for the third valve v3 and the fifth valve v5 are closed.

In the second cleaning process, the cleaning gas may be supplied to the first lower inflow groove 243a by the absorption force through the connection channel 215 to remove the residual thin film which remains in the blind area in the cleaning process of the existing apparatus. In the deposition apparatus according to the exemplary embodiment, since the connection channel connecting the gas inflow channel which is defined by the lower gas flow control plate and the gas outflow channel is formed, a part of the cleaning gas is supplied to the gas inflow channel by the absorption force of the outflow channel and then flows out to the outflow channel through the connection channel. As such, since the cleaning gas may sufficiently move toward the gas inflow channel which is defined by the lower gas flow control plate, the residual thin film which remains on the gas flow control plate may be fully removed, thereby increasing the cleaning efficiency. While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
    a reaction space;
    a plurality of gas inlets and gas outlets;
    a gas flow control guide structure disposed in the reaction space;
    a reaction chamber including a reactor support installing a substrate in the reaction space,
    wherein the gas flow control guide structure defines a plurality of gas inflow channels disposed between the plurality of gas inlets and the reaction space;
    a gas outflow channel disposed between the reaction space and the plurality of gas outlets; and
    a connection channel connecting at least one of the plurality of gas inflow channels and the gas outflow channel.

2. The deposition apparatus of claim 1, further comprising:
    an inert gas inlet to which an inert gas is supplied,
    wherein the connection channel is connected to the inert gas inlet.

3. The deposition apparatus of claim 2, wherein:
    the gas flow control guide structure includes an upper gas flow control plate and a lower gas flow control plate which are stacked, and
    the connection channel is defined by a groove formed in the lower gas flow control plate.

4. The deposition apparatus of claim 3, wherein the groove has a narrow straight-line shape.

5. The deposition apparatus of claim 4, wherein the groove has a plurality of narrow straight-line shapes.

6. The deposition apparatus of claim 3, wherein the groove has a shape which is widened toward an edge of the lower gas flow control plate from a center of the lower gas flow control plate.

7. The deposition apparatus of claim 3, further comprising:
    a plurality of inert gas inlets; and
    a plurality of connection channels,
    wherein each one of the plurality of connection channels is connected with a respectively corresponding one of the plurality of inert gas inlets.

8. The deposition apparatus of claim 3, wherein the plurality of gas inflow channels are defined by grooves of the upper gas flow control plate and the lower gas flow control plate.

9. The deposition apparatus of claim 8, wherein the grooves have a narrow straight-line shape.

10. The deposition apparatus of claim 9, wherein the grooves have a plurality of narrow straight-line shapes.

11. The deposition apparatus of claim 8, wherein the grooves have a shape which is widened toward an edge of the lower gas flow control plate from a center of the lower gas flow control plate.

12. The deposition apparatus of claim 8, further comprising:
    a plurality of inert gas inlets; and
    a plurality of connection channels,
    wherein each one of the plurality of connection channels is connected with a respectively corresponding one of the plurality of inert gas inlets.

13. The deposition apparatus of claim 2, further comprising:
    a plurality of inert gas inlets; and
    a plurality of connection channels,
    wherein each one of the plurality of connection channels is connected with a respectively corresponding one of the plurality of inert gas inlets.

14. The deposition apparatus of claim 2, wherein the gas flow control guide structure further comprises a convex portion defining a side wall of one of the plurality of gas inflow channels.

15. The deposition apparatus of claim 14, wherein the connection channel passes through the convex portion to be connected to the gas outflow channel.

16. The deposition apparatus of claim 15, wherein:
    the gas flow control guide structure further comprises at least one through hole formed in the convex portion, and
    the inert gas inlet is connected to the connection channel through the through hole.

17. The deposition apparatus of claim 16, wherein the inert gas inlet is connected to a valve for controlling supplying and blocking the inert gas.

18. The deposition apparatus of claim 17, wherein the gas inlets and the gas outlets are connected to a valve, respectively.

19. The deposition apparatus of claim 16, wherein the plurality of gas inlets are connected to the plurality of gas inflow channels through the at least one through hole.

* * * * *